United States Patent
Cheng et al.

(10) Patent No.: US 10,700,205 B2
(45) Date of Patent: Jun. 30, 2020

(54) METHOD FOR FORMING SEMICONDUCTOR STRUCTURE

(71) Applicant: TAIWAN SEMICONDUCTOR MANUFACTURING COMPANY LTD., Hsinchu (TW)

(72) Inventors: Chao-Ching Cheng, Hsinchu (TW); Chen-Feng Hsu, Hsinchu (TW); Yu-Lin Yang, Hsinchu County (TW); Jung-Piao Chiu, Kaohsiung (TW); Tzu-Chiang Chen, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/404,275

(22) Filed: May 6, 2019

(65) Prior Publication Data
US 2019/0259877 A1    Aug. 22, 2019

Related U.S. Application Data

(62) Division of application No. 15/719,409, filed on Sep. 28, 2017, now Pat. No. 10,283,639.

(51) Int. Cl.
| | |
|---|---|
| *H01L 29/78* | (2006.01) |
| *H01L 29/66* | (2006.01) |
| *H01L 29/165* | (2006.01) |
| *H01L 29/06* | (2006.01) |
| *H01L 29/10* | (2006.01) |
| *H01L 29/205* | (2006.01) |

(Continued)

(52) U.S. Cl.
CPC .... *H01L 29/7849* (2013.01); *H01L 21/76224* (2013.01); *H01L 21/8258* (2013.01); *H01L 21/823807* (2013.01); *H01L 21/823821* (2013.01); *H01L 21/823878* (2013.01); *H01L 27/0924* (2013.01); *H01L 29/0649* (2013.01); *H01L 29/1054* (2013.01); *H01L 29/165* (2013.01); *H01L 29/205* (2013.01); *H01L 29/6653* (2013.01); *H01L 29/66356* (2013.01); *H01L 29/66795* (2013.01); *H01L 29/7391* (2013.01); *H01L 29/785* (2013.01); *H01L 21/845* (2013.01); *H01L 27/1211* (2013.01)

(58) Field of Classification Search
None
See application file for complete search history.

(56) References Cited

U.S. PATENT DOCUMENTS

| | | | |
|---|---|---|---|
| 7,256,078 B2 * | 8/2007 | Anderson | H01L 21/84 257/E21.421 |
| 8,835,268 B2 * | 9/2014 | Sudo | H01L 27/228 257/E21.619 |

(Continued)

*Primary Examiner* — Nishath Yasmeen
(74) *Attorney, Agent, or Firm* — WPAT, P.C., Intellectual Property Attorneys; Anthony King

(57) ABSTRACT

A method for forming a semiconductor structure includes receiving a substrate including a dielectric structure; forming a first recess in the substrate; forming a dielectric spacer over a sidewall of the first recess; forming a first semiconductor layer to fill the first recess; removing the dielectric structure to form a second recess over the substrate; and forming a second semiconductor layer to fill the second recess. The dielectric spacer is sandwiched between the first semiconductor layer and the second semiconductor layer.

20 Claims, 15 Drawing Sheets

(51) Int. Cl.
*H01L 21/8238* (2006.01)
*H01L 21/8258* (2006.01)
*H01L 21/762* (2006.01)
*H01L 29/739* (2006.01)
*H01L 27/092* (2006.01)
*H01L 21/84* (2006.01)
*H01L 27/12* (2006.01)

(56) References Cited

U.S. PATENT DOCUMENTS

| | | | |
|---|---|---|---|
| 9,240,447 B1 * | 1/2016 | Cheng | H01L 21/02639 |
| 2007/0249174 A1 * | 10/2007 | Yang | H01L 21/0334 |
| | | | 438/712 |
| 2016/0086858 A1 * | 3/2016 | Cheng | H01L 21/82382 |
| | | | 257/618 |

* cited by examiner

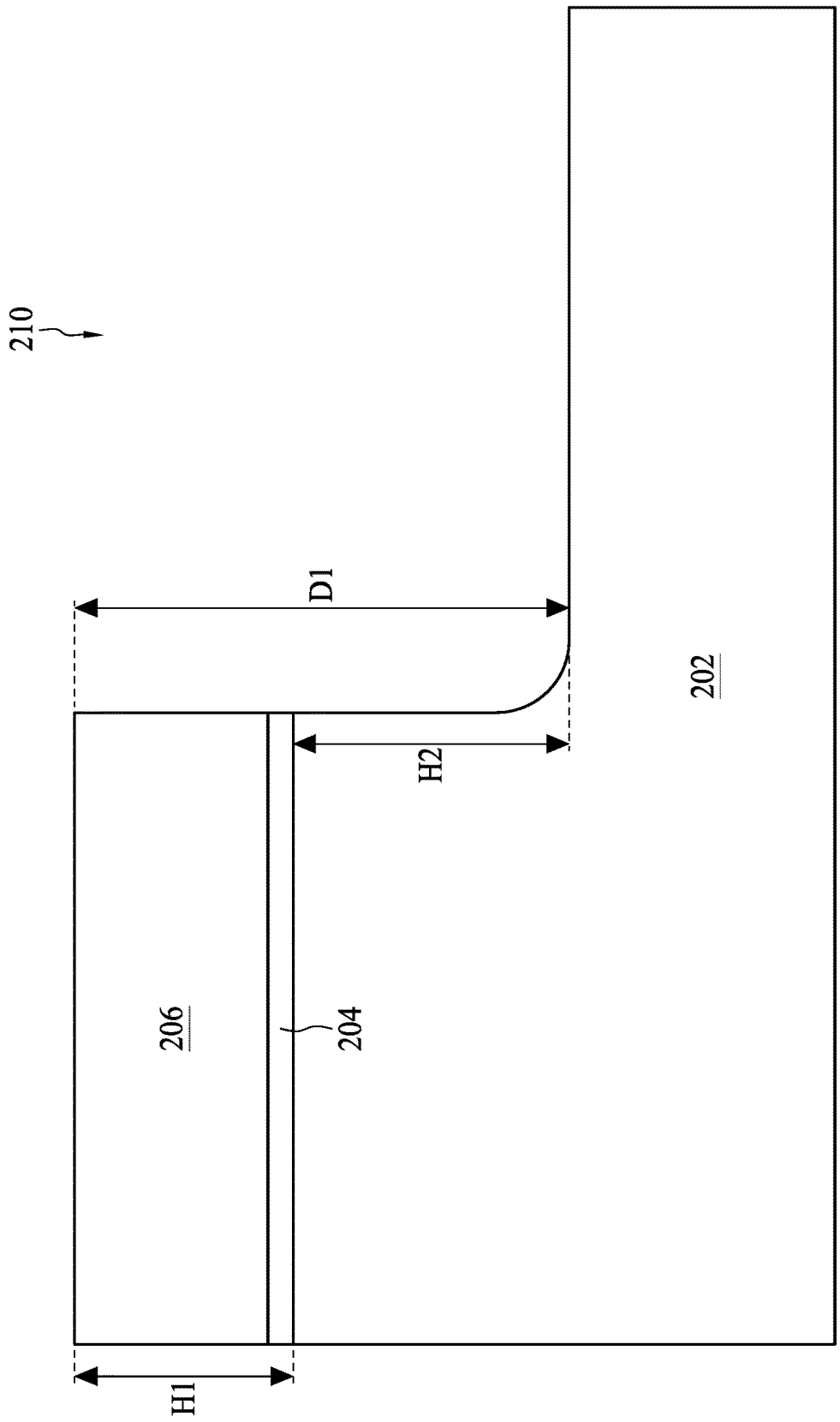

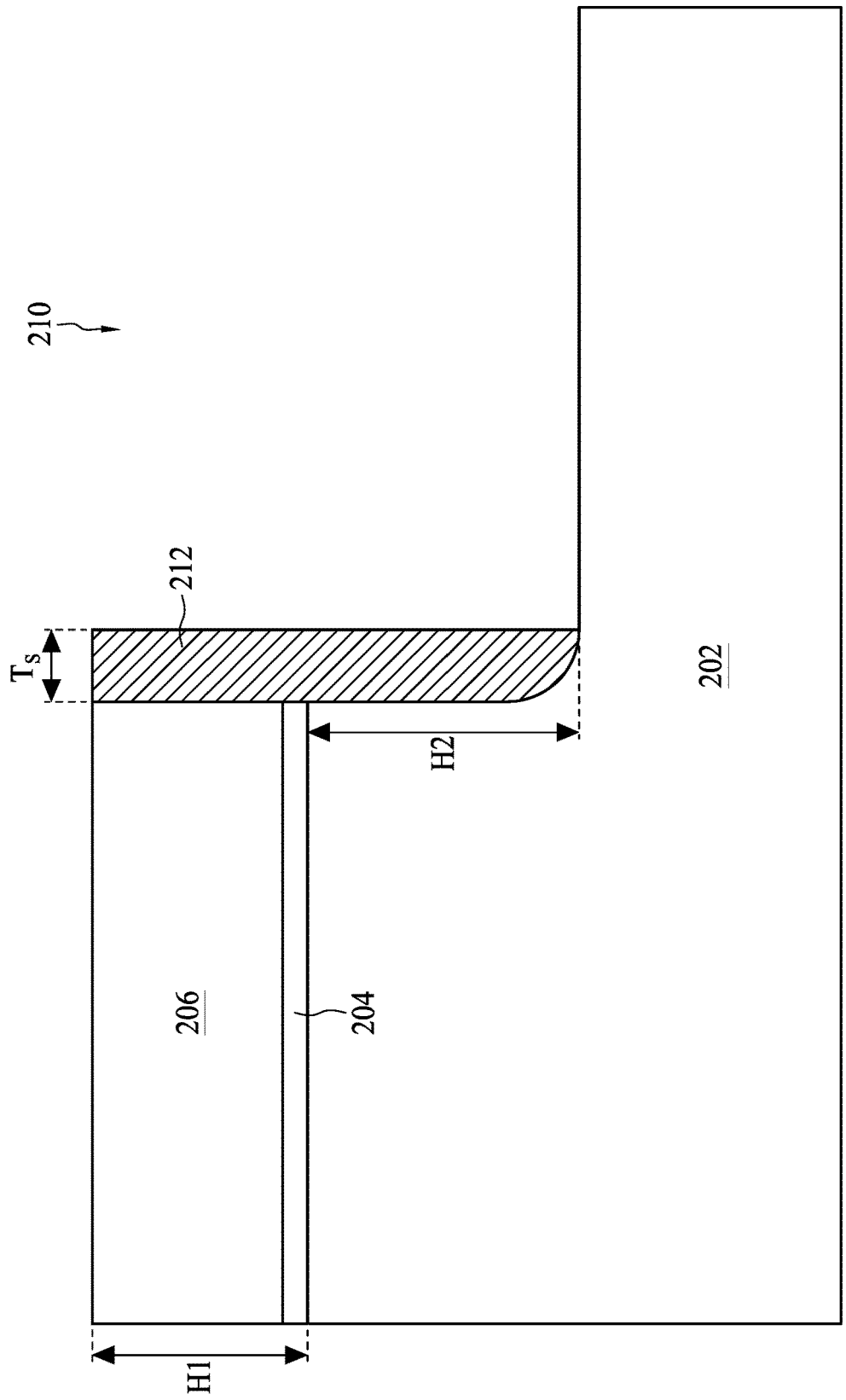

METHOD FOR FORMING SEMICONDUCTOR STRUCTURE

PRIORITY CLAIM AND CROSS-REFERENCE

This application is a divisional application of U.S. patent application Ser. No. 15/719,409, filed on Sep. 28, 2017, entitled of "SEMICONDUCTOR STRUCTURE AND METHOD FOR FORMING THE SAME," which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on single semiconductor wafer, and individual dies on the wafer are singulated by sawing a scribe line between the integrated circuit dies. The individual dies are typically packaged separately, in multi-chip modules, or in other types of packaging for example.

As the semiconductor industry has progressed into nanometer technology process nodes in pursuit of higher device density, higher performance and lower costs, challenges from both fabrication and design issues have resulted in the development of three-dimensional designs, such as the fin field effect transistor (FinFET). FinFETs are fabricated with a thin "fin" or "fin structure" vertically extending from a substrate, and a gate electrode is formed over the fin. Thus, the channel of the FinFET is formed. Advantages of the FinFET may include reducing the short channel effect and higher current flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2J illustrate a semiconductor structure at various fabrication stages constructed according to aspects of the present disclosure in one or more embodiments.

DETAILED DESCRIPTION

Figure 1:
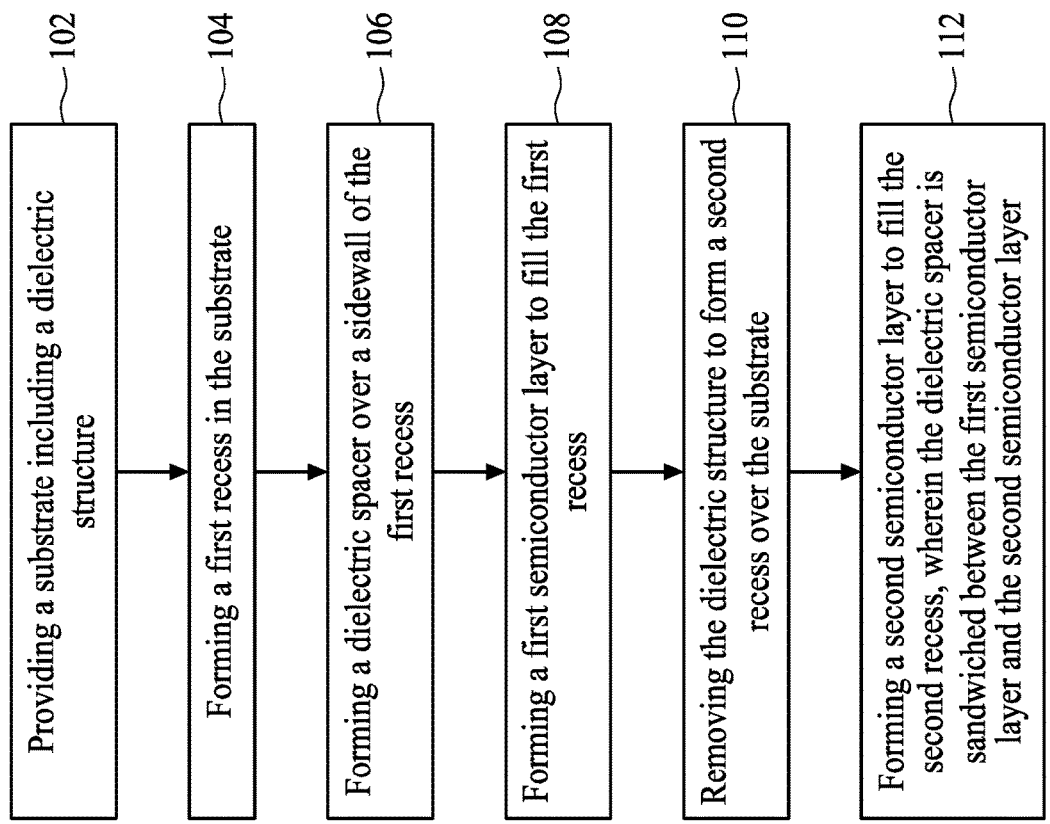
FIG. 1 shows a flow chart representing a method for forming a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Examples of devices that can benefit from one or more embodiments of the present disclosure are semiconductor devices such as, for example but not limited, a fin-like field effect transistor (FinFET) device. The FinFET device, for example, may be a complementary metal-oxide-semiconductor (CMOS) device including a p-type MOS FinFET device and an n-type MOS FinFET device. The following disclosure will continue with a CMOS FinFET device to illustrate various embodiments of the present disclosure. It is understood, however, that the application should be not limited to a particular type of device, except as specifically claimed.

FIG. 1 is a flow chart representing a method for forming a semiconductor structure 10 according to aspects of the present disclosure. The method for forming the semiconductor structure 10 includes an operation 102, providing a substrate including a dielectric structure. The method for forming the semiconductor structure 10 further includes an operation 104, forming a first recess in the substrate. The method for forming the semiconductor structure 10 further includes an operation 106, forming a dielectric spacer over a sidewall of the first recess. The method for forming the semiconductor structure 10 further includes an operation 108, forming a first semiconductor layer to fill the first recess. The method for forming the semiconductor structure 10 further includes an operation 110, removing the dielectric structure to form a second recess over the substrate. The method for forming the semiconductor structure 10 further includes an operation 112, forming at least a second semiconductor layer to fill the second recess, wherein the dielectric spacer is sandwiched between the first semiconductor layer and the second semiconductor layer. The method for forming the semiconductor structure 10 will be further described according to one or more embodiments. It should be noted that the operations of the method for forming the semiconductor structure 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2A:
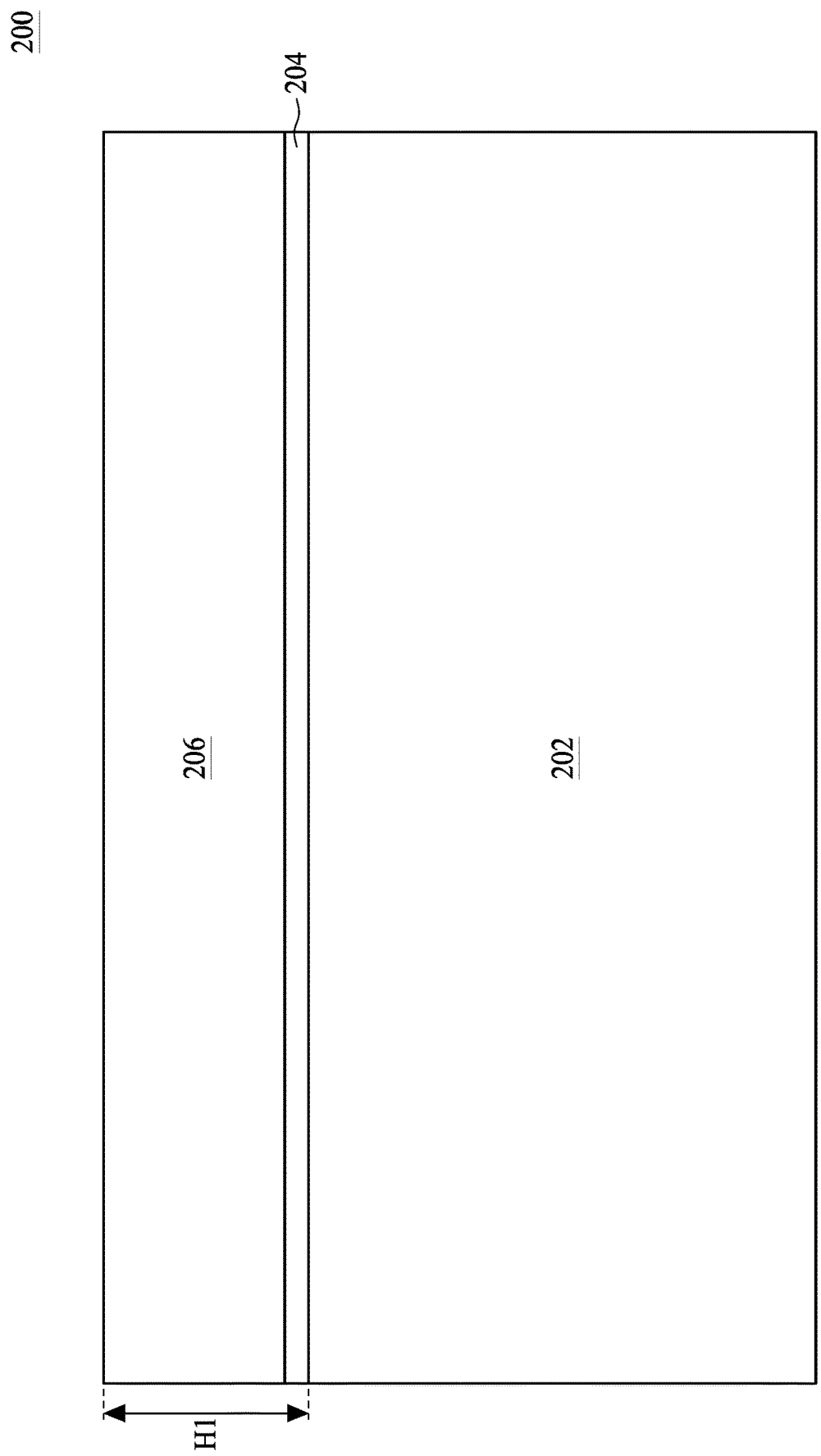

FIG. 2A through FIG. 2J are drawings illustrating a semiconductor structure 200 at various fabrication stages constructed according to aspects of the present disclosure in one or more embodiments. Referring to FIG. 2A, a substrate 202 is provided according to operation 102. In some embodiments of the present disclosure, the substrate 202 may be made of silicon or other semiconductor materials. Alternatively or additionally, the substrate 202 may include other elementary semiconductor materials such as germanium. In some embodiments, the substrate 202 is made of a compound semiconductor such as silicon carbide (SiC), gallium arsenic (GaAs), indium arsenide (InAs), indium phosphide (InP) or the like. In some embodiments, the substrate 202 is made of an alloy semiconductor such as silicon germanium (SiGe), silicon germanium carbide (SiGeC), gallium arsenic phosphide (GaAsP), gallium indium phosphide (GaInP), or the like. In some embodiments, the substrate 202 includes an epitaxial layer. For example, the substrate 202 includes an epitaxial layer overlying a bulk semiconductor. In some embodiments, the substrate 202 can include a silicon-on-insulator (SOI) substrate or a germanium-on-insulator (GOI) substrate. In some embodiments, the substrate 202 can include various doped regions and other suitable features.

Still referring to FIG. 2A, a pad layer 204 such as a pad oxide layer is formed over the substrate 202. In some embodiments, an anti-punch through implant (APT) region (not shown) can be formed in the substrate 202. The APT region is used to reduce sub-threshold source-to-drain leakage and Drain-Induced Barrier Lowering (DIBL). The APT region may be an n-type APT region or a p-type APT region. In some embodiments, the n-type APT region is obtained by doping with n-type dopant, such as As, P, or antimony (Sb). In some embodiments, the p-type APT region is obtained by doping with p-type dopant, such as boron (B), or boron fluorine ($BF_2$). In some embodiments, a thermal operation can be performed to activate the dopant in the APT region. In some embodiments, the thermal process is performed by a rapid thermal annealing process, but not limited to this. Subsequently, a dielectric structure 206 is formed over the pad layer 204. In some embodiments of the present disclosure, the dielectric structure 206 can include silicon oxide (SiO), silicon nitride (SiN), or the like. In some embodiment, the dielectric structure 206 can include a bi-layered structure including SiO and SiN, but not limited to this. The dielectric structure 206 and the pad layer 204 can include different materials. As shown in FIG. 2A, the pad layer 204 and the dielectric structure 206 include a height H1. In some embodiments, the height H1 of the pad layer 204 and the dielectric structure 206 is ranged from about 50 nanometers (nm) to about 100 nm, but not limited to this.

Referring to FIG. 2B, a patterned hard mask (not shown) can be formed over the dielectric structure 206. Next, an etching operation such as, for example but not limited to, a dry etching operation is performed to remove a portion of the dielectric structure 206, a portion of the pad layer 204 and a portion of the substrate 202 with the patterned hard mask serving as an etching mask. Consequently, at least a first recess 210 is formed in the substrate 202 according to operation 104. As shown in FIG. 2B, the first recess 210 can be formed not only in the substrate 202 but also in the dielectric structure 206. Accordingly, the substrate 202 is exposed from a bottom of the first recess 210 while the substrate 202, the pad layer 204 and the dielectric structure 206 are exposed from sidewalls of the first recess 210. In some embodiments, the first recess 210 can include at least one rounding corner as shown in FIG. 2B. In some embodiment, a height H2, which equals to a thickness of the portion of the substrate 202 being removed, can be defined from a bottom of the pad layer 204 to the bottom of the first recess 210. In some embodiments, the height H2 can be ranged from about 1 nm to about 200 nm, but not limited to this. Accordingly, the first recess 210 includes a depth D1, and the depth D1 substantially equals to a sum of the first height H1 of the dielectric structure 206 and the pad layer 204 and the height H2 of the portion of the substrate 202 being removed. The patterned hard mask can be removed after forming the first recess 210.

Referring to FIG. 2C, a dielectric layer is then formed over the substrate 202 and followed by another etching operation such as a dry etching operation. Consequently, a dielectric spacer 212 is formed over the sidewall of the first recess 210 according to operation 106. As shown in FIG. 2C, the dielectric spacer 212 covers the dielectric structure 206, the pad layer 204 and the substrate 202 exposed from the sidewall of the first recess 210. In some embodiments, a thickness $T_S$ of the dielectric spacer 212 is ranged from about 3 nm to about 20 nm, but not limited to this. In some embodiments, the dielectric spacer 212 can include SiO, SiN or the like. In some embodiments, the dielectric spacer 212 can include a bi-layered structure such as a SiO/SiN bi-layer, but not limited to this. Further, the dielectric spacer 212 and the dielectric structure 206 can include different dielectric materials in some embodiments, but not limited to this.

Figure 2D:
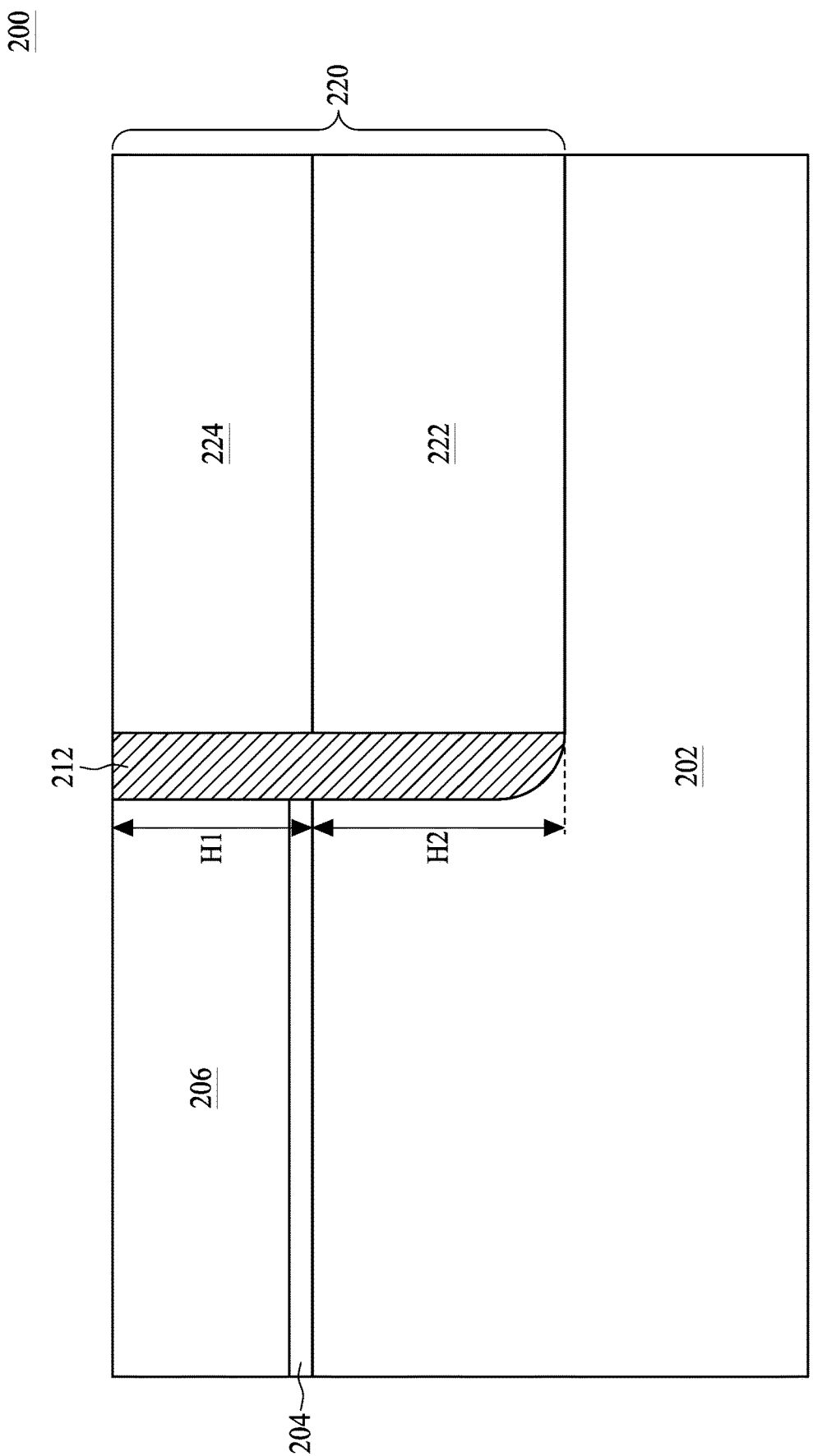

Referring to FIG. 2D, a first semiconductor layer 220 is formed to fill the first recess 210 according to operation 108. In some embodiments, the first semiconductor layer 220 includes a single-layered structure. In some embodiments, the first semiconductor layer 220 is a multi-layered structure including, for example but not limited to, at least a first layer 222 and a second layer 224. In some embodiments, the first semiconductor layer 220 (including the first layer 222 and the second layer 224) can be formed by epitaxial operation(s). The epitaxial operation may include a selective epitaxial growth (SEG) operation, CVD deposition techniques such as a vapor-phase epitaxy (VPE) and/or ultra high vacuum CVD (UHV-CVD), molecular beam epitaxy, or other suitable epitaxial operation. In some embodiments, the first layer 222 can be formed in the first recess 210 after a pre-clean operation, and a thickness of the first layer 222 is smaller than the depth D1 of the first recess 210. Further, the thickness of the first layer 222 can be smaller than, equal to, or larger than the height H2. In some embodiments, the second layer 224 is formed over the first layer 222 to fill up the first recess 210, and followed by a planarization operation for removing excessive materials. Consequently, a top surface of the dielectric structure 206, a top surface of the dielectric spacer 212 and a top surface of the first semiconductor layer 220 (or a top surface of the second layer 224) are exposed as shown in FIG. 2D. In some embodiments, the first layer 222 can be a buffer layer between the second layer 224 and the substrate 202. In some embodiments when the first semiconductor layer 220 is adopted for a pFET device, the first layer 222 can be a $Si_{1-x}Ge_x$ graded buffer layer and the second layer 224 can be a $Si_{1-y}Ge_y$ channel layer, and x is smaller than y. In some embodiments when the first semiconductor layer 220 is adopted for the pFET device, the first layer 222 can be a $Si_{1-x}Ge_x$ graded buffer layer and the second layer 224 can be a Ge channel layer, and x is smaller than 1. In some embodiments when the first semiconductor layer 220 is adopted for an nFET device, the first layer 222 can be a $Si_{1-x}Ge_x$ graded buffer layer and the second layer 224 can be a Si channel layer, and x is larger than 0. The strained epitaxial layer over the strained-relaxed or graded buffer epitaxial layer can be formed from the bottom of the first recess 210 such that the epitaxy defects are trapped in the bottom, and thus the high mobility materials required to improve device performance is obtained.

Figure 2E:
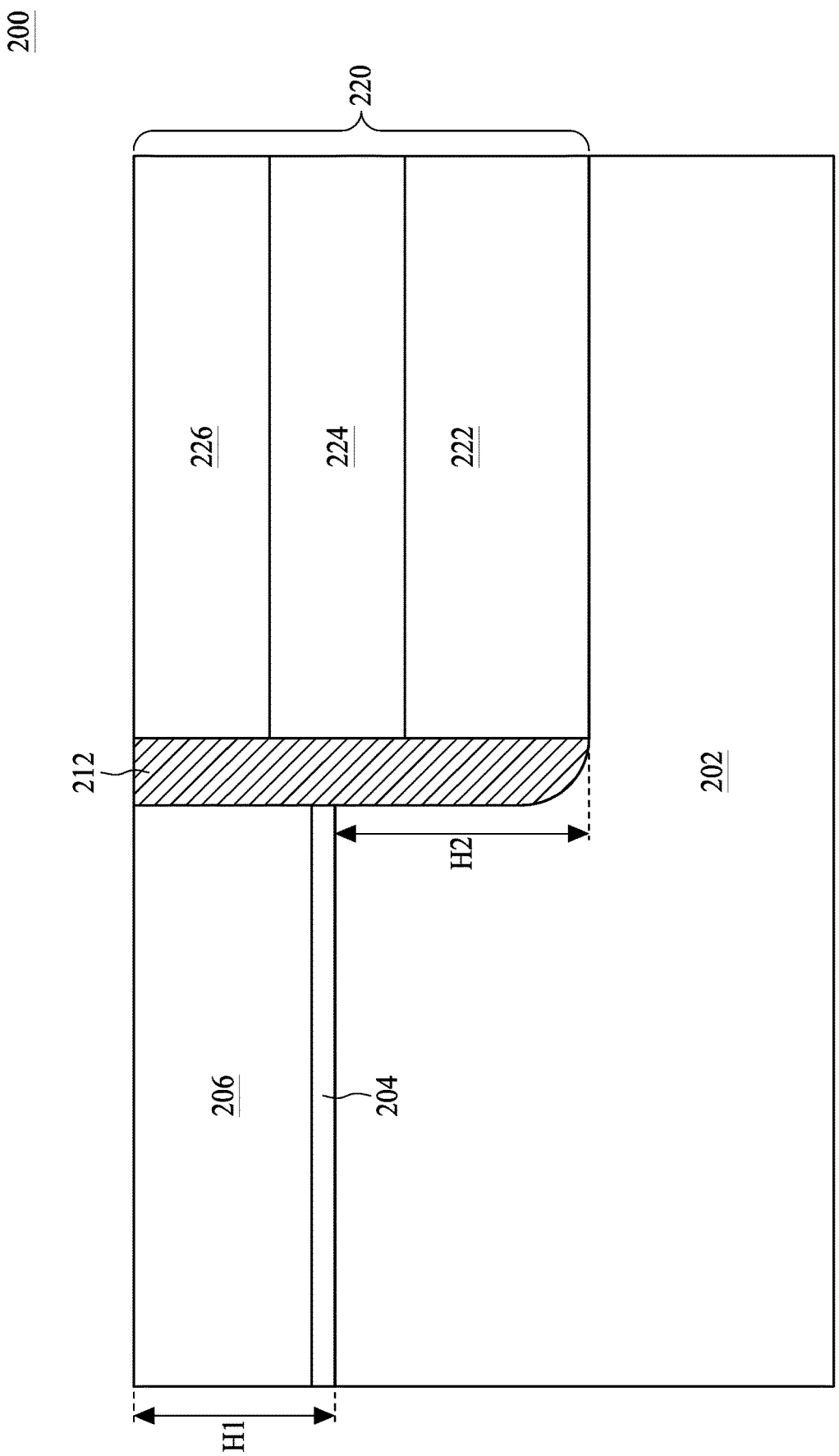

Referring to FIG. 2E, in some embodiments of the present disclosure, the first semiconductor layer 220 is a multi-layered structure including, for example but not limited to, at least a first layer 222, a second layer 224 and a third layer 226. The first layer 222, the second layer 224 and the third layer 226 can be sequentially formed in the first recess 210 after a pre-clean operation. In some embodiments, the first semiconductor layer 220 (including the first layer 222, the second layer 224 and the third layer 226) can be formed by epitaxial operation(s). The epitaxial operation may include a SEG operation, CVD deposition techniques such as a VPE and/or UHV-CVD, molecular beam epitaxy, or other suitable epitaxial operation. Since the sidewall of the first recess 210 is covered by the dielectric spacer 212, the first semiconductor layer 220 mainly formed from the bottom of the first recess 210 is obtained. And a planarization operation is subsequently performed to remove excessive materials. Consequently, a top surface of the dielectric structure 206, a top surface of the dielectric spacer 212 and a top surface of the first semiconductor layer 220 (or a top surface of the third layer 226) are exposed as shown in FIG. 2E. In some embodiments, when the first semiconductor layer 220 is adopted for an nFET device, the first layer 222 can be a $Si_{1-x}Ge_x$ layer, the second layer 224 can be a Ge graded-buffer layer, and the third layer 226 can be an III-V channel layer such as GaAs channel layer. In some embodiments when the first semiconductor layer 220 is adopted for the nFET device, the first layer 222 can be a Ge layer, the second layer 224 can be an III-V graded buffer layer, and the third layer 226 can be an III-V channel layer such as a GaAs channel layer. In some embodiments of the present disclosure, the III-V materials include InAs, InGaAs, InGaSb, InP, AlSb, and the like. As mentioned above, the strained epitaxial layer over the strained-relaxed epitaxial layer can be from the bottom of the first recess 210 such that the epitaxy defects are trapped in the bottom, and thus the high mobility materials required to improve device performance is obtained.

Figure 2F:
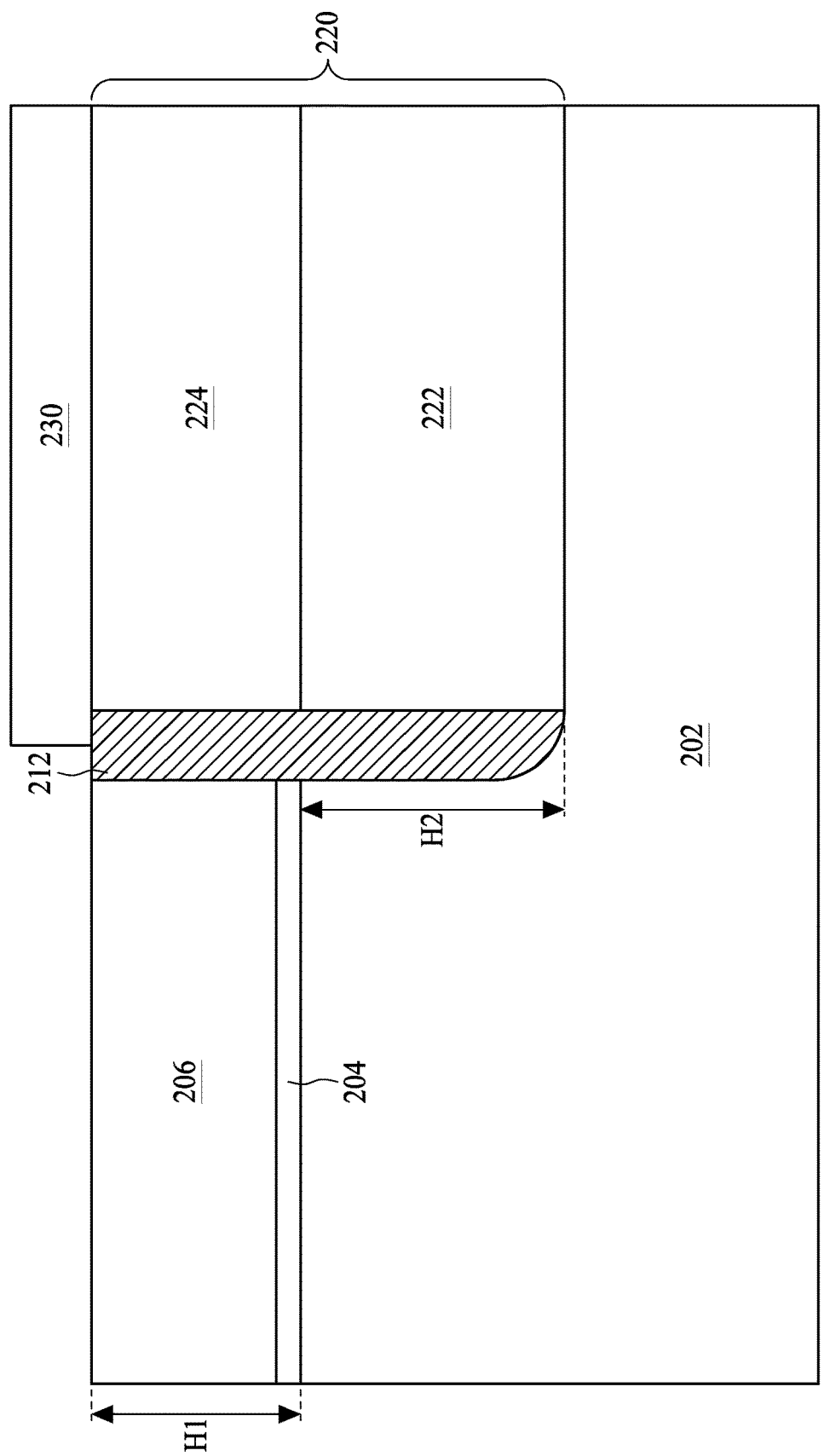
Figure 2G:
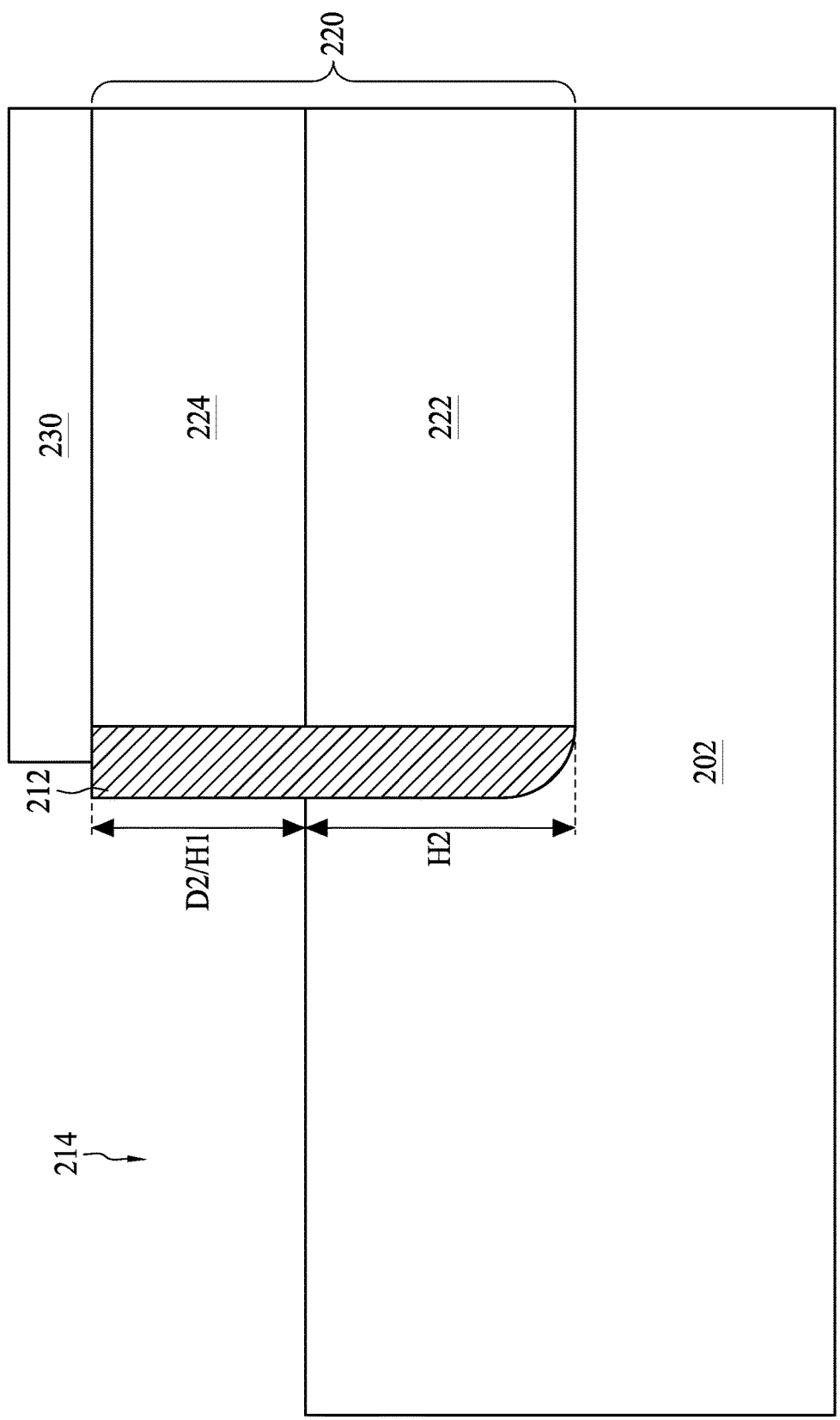

Referring to FIGS. 2F and 2G, a patterned mask layer 230 is formed over the first semiconductor layer 220. As shown in FIG. 2F, the patterned mask layer 230 covers at least a portion of the first semiconductor layer 220. In other words, at least a portion of the dielectric structure 206 is exposed. Next, an etching operation is performed to remove the exposed portion of the dielectric structure 206 and the pad layer 204. Consequently, a second recess 214 is formed over the substrate 202 according to operation 110. In some embodiments, the substrate 202 is exposed from a bottom of the second recess 214 and the dielectric spacer 212 is exposed from a sidewall of the second recess 214 as shown in FIG. 2G. In some embodiments, a depth D2 of the second recess 214 substantially equals to the height H1 of the dielectric structure 206, but not limited to this.

Figure 2H:
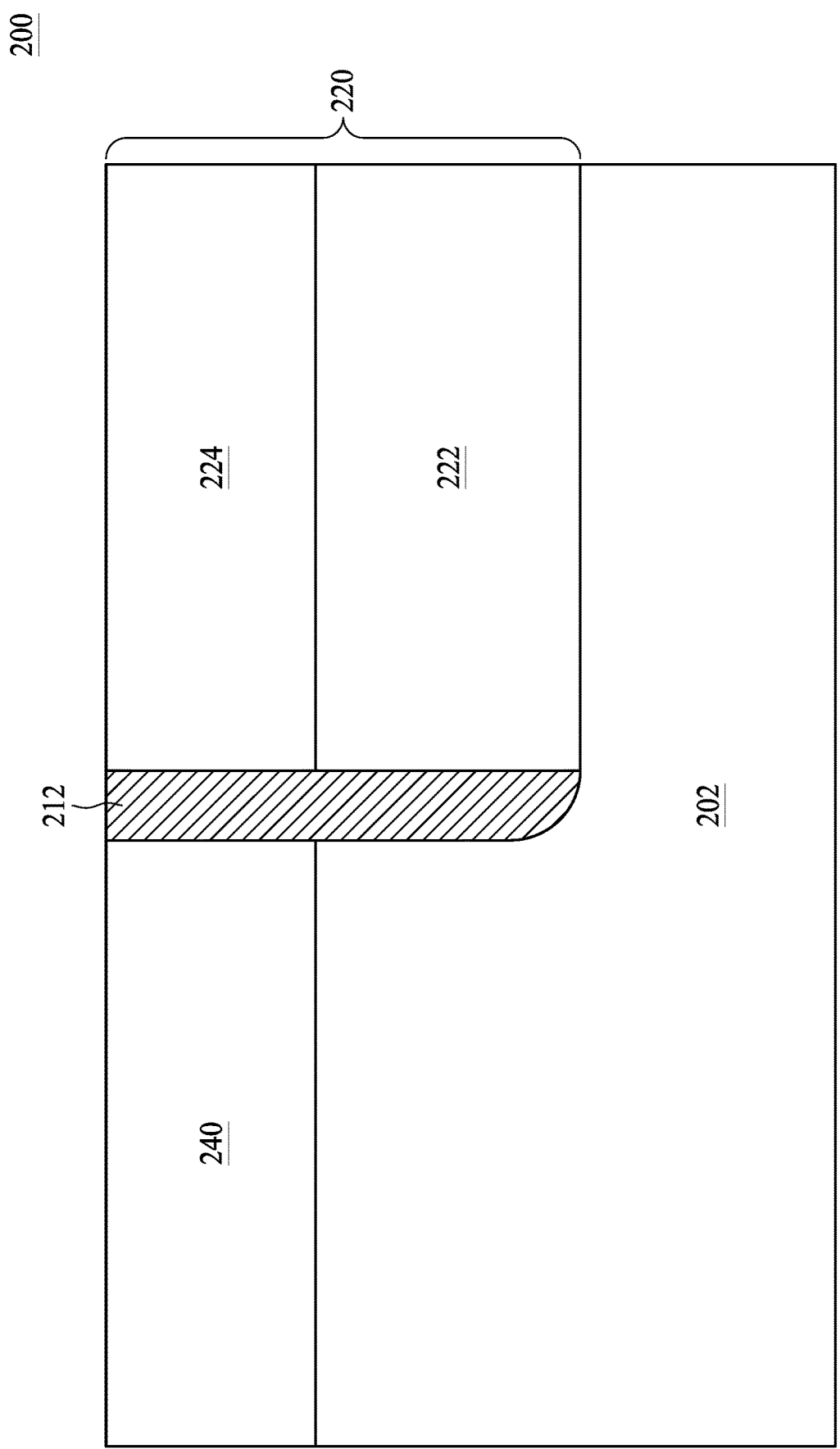

Referring to FIG. 2H, a second semiconductor layer 240 is formed to fill the second recess 214 according to operation 112. In some embodiments, the second semiconductor layer 240 can be formed by an epitaxial operation. The epitaxial operation may include a SEG operation, CVD deposition techniques such as a VPE and/or UHV-CVD, molecular beam epitaxy, or other suitable epitaxial operation. Since the sidewall of the second recess 214 is covered by the dielectric spacer 212, the second semiconductor layer 240 mainly formed from the bottom of the second recess 214 is obtained. A planarization operation can be subsequently performed to remove excessive materials. Consequently, a top surface of the second semiconductor layer 240, a top surface of the first semiconductor layer 220, and a top surface of the dielectric spacer 212 are exposed as shown in FIG. 2H. Furthermore, the dielectric spacer 212 is sandwiched between the first semiconductor layer 220 and the second semiconductor layer 240. In some embodiments, the second semiconductor layer 240 includes a single-layered structure. For example, when the second semiconductor layer 240 is adopted for a pFET device, the second semiconductor layer 240 can include a $Si_{1-x}Ge_x$ epitaxial layer. In some embodiments, the second semiconductor layer 240 is a multi-layered structure. For example but not limited to, when the second semiconductor layer 240 is adopted for an nFET device, the second semiconductor layer 240 can sequentially and upwardly include a $Si_{1-x}Ge_x$ graded-buffer layer and a Si channel layer from the bottom of the second recess 214. Still in some embodiments, the second semiconductor layer 240 can include a $Si_{1-x}Ge_x$ stack. The strained epitaxial layer over the strained-relaxed epitaxial layer or the graded-buffer layer can be from the bottom of the second recess 214 such that the epitaxy defects are trapped in the bottom, and thus the high mobility materials required to improve device performance is obtained.

Figure 2I:
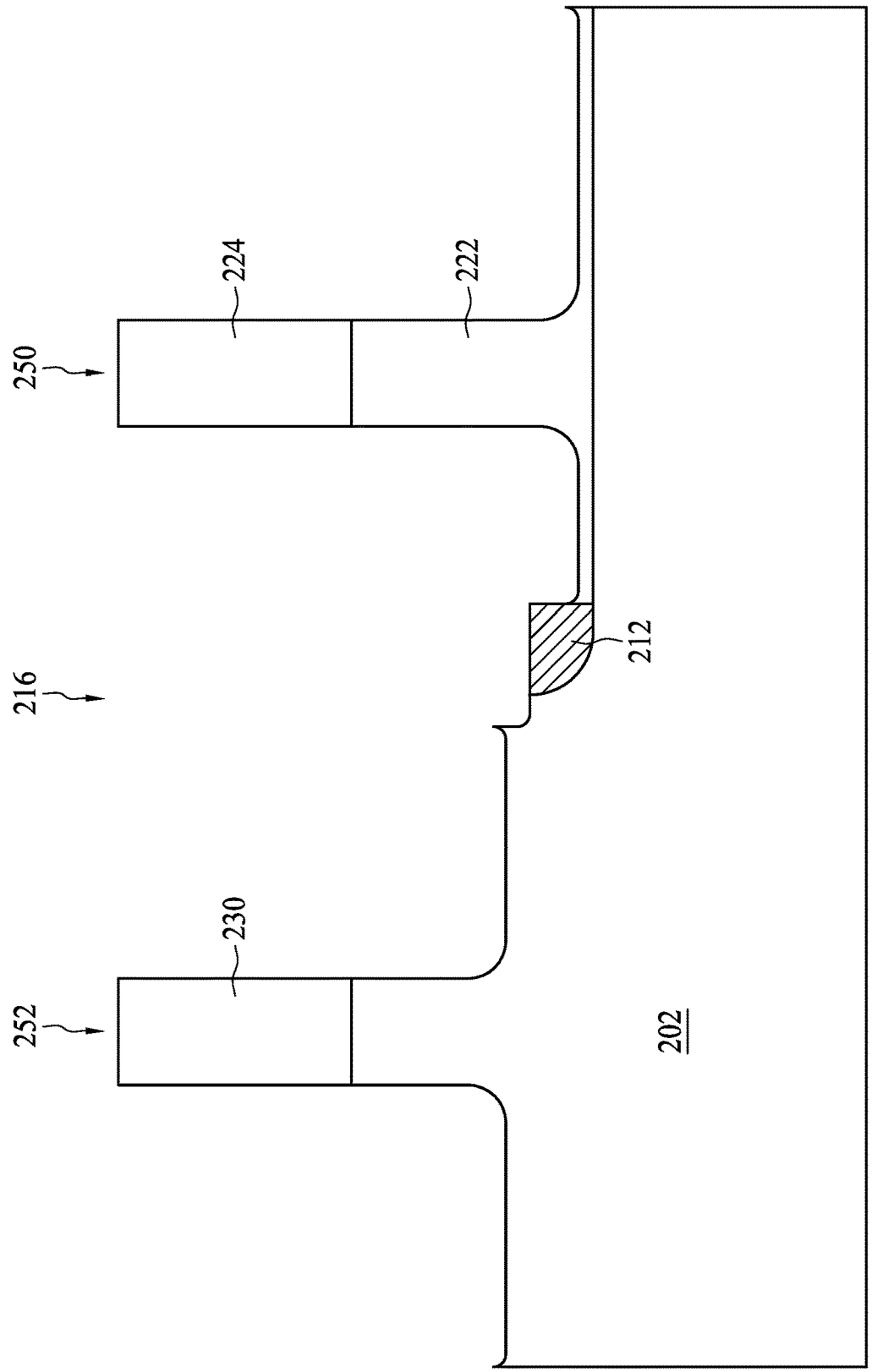

Referring to FIG. 2I, a portion of the first semiconductor layer 220 is removed to form at least a first fin structure 250 over the substrate 202 and a portion of the second semiconductor layer 240 is removed to form at least a second fin structure 252 over the substrate 202. In some embodiments of the present disclosure, the portion of the first semiconductor layer 220 and the portion of the second semiconductor layer 240 can be removed simultaneously. However the portion of the first semiconductor layer 220 and the portion of the second semiconductor layer 240 can be removed sequentially. It should be noted that the number of the first fin structure 250 and the second fin structure 252 may be adjusted according to different requirements. In some embodiments, at least a portion of the dielectric spacer 212 can be removed before, after or during removing the first semiconductor layer 220 and/or the second semiconductor layer 240. Consequently, a third recess 216 is formed, and the first fin structure 250 and the second fin structure 252 are exposed from the third recess 216 as shown in FIG. 2I. Since the first semiconductor layer 220, the second semiconductor layer 240 and the dielectric spacer 212 include different materials, etching rates of the first semiconductor layer 220, the second semiconductor layer 240 and the dielectric spacer 212 are different using the same or different etchant. And thus the third recess 216 can include different depths as shown in FIG. 2I. Further, the substrate 202, the dielectric spacer 212 and the first semiconductor layer 220 are exposed from the bottom of the third recess 216 in some embodiments. Additionally, the ATP region (not shown) can be formed in the first fin structure 250 and the second fin structure 252 and followed by a thermal operation in some embodiments.

Figure 2J:
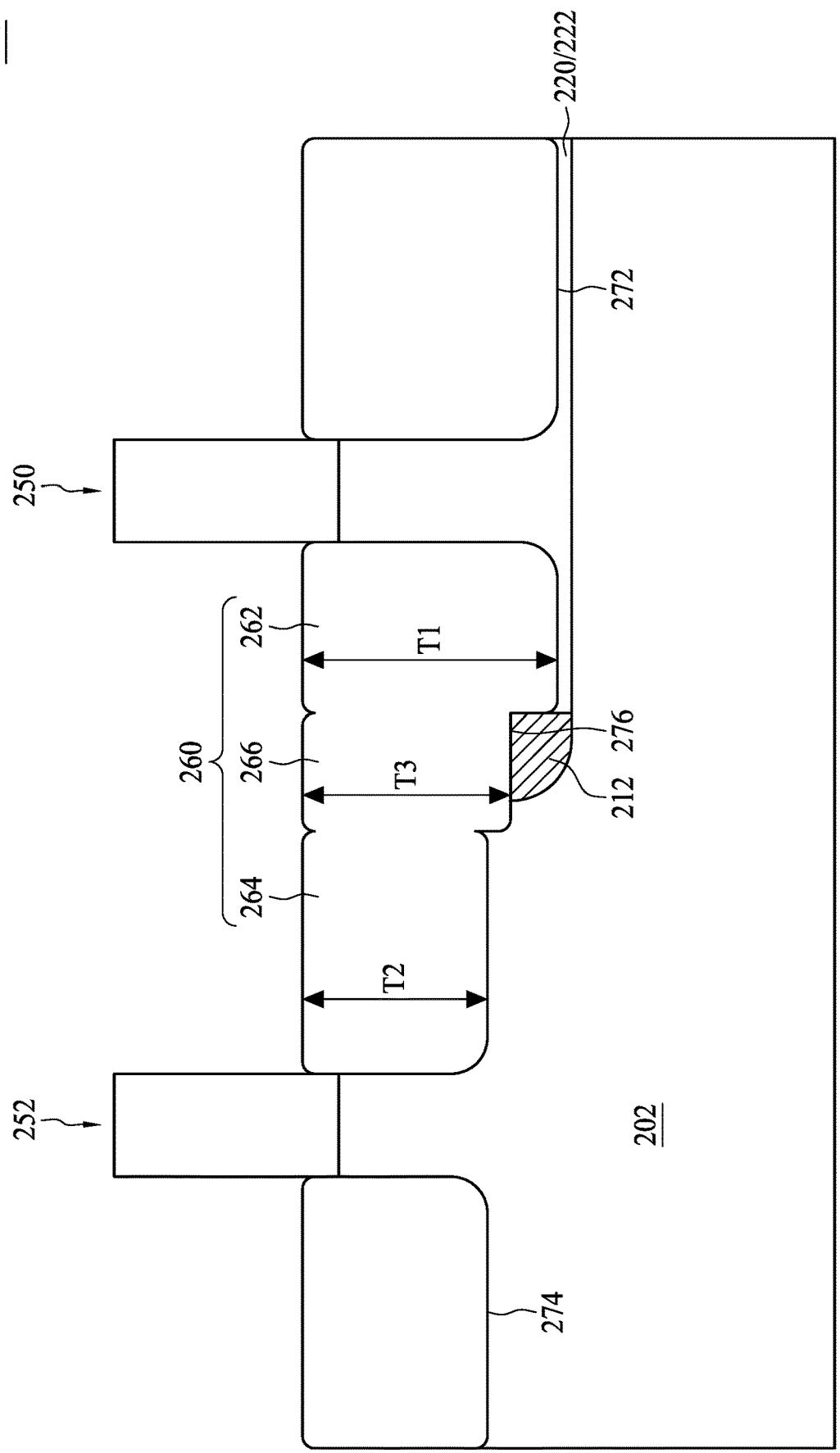

Referring to FIG. 2J, an insulating material is then disposed to fill the third recess 216 and followed by removing a portion of the insulating material to form an isolation structure 260 in the third recess 216. More importantly, the first fin structure 250 and the second fin structure 252 are exposed from the isolation structure 260 as shown in FIG. 2J. Accordingly, the semiconductor structure 200 includes the first fin structure 250 disposed over the substrate 202, the second fin structure 252 disposed over the substrate 202, and the isolation structure 260 disposed between the first fin structure 250 and the second fin structure 252. In some embodiments of the present disclosure, the first fin structure 250 and the second fin structure 252 are complementary to each other, but not limited to this. More importantly, the first fin structure 250 is spaced apart and electrically isolated from the second fin structure 252 by the isolation structure 260. As mentioned above, since the third recess 216 includes different depths, the isolation structure 260 formed in the third recess 216 includes different thicknesses. Still referring to FIG. 2J, the isolation structure 260 can include a first portion 262 adjacent to the first fin structure 250, a second portion 264 adjacent to the second fin structure 252 and a third portion 266 sandwiched between the first portion 262 and the second portion 264 in some embodiments. And the third portion 266 physically contacts and connects to both of the first portion 262 and the second portion 264. The first portion 262 includes a first thickness T1, the second portion 264 includes a second thickness T2, and the third portion 266 includes the third thickness T3. In some embodiments, the first thickness T1 is defined between a top surface and a bottom surface of the first portion 262, the second thickness T2 is defined between a top surface and a bottom surface of the second portion 264, and the third thickness T3 is defined between a top surface and a bottom surface of the third portion 266. In some embodiments, the first thickness T1 is greater than the third thickness T3, and the third thickness T3 is greater than the second thickness T2. In some embodiments, the third portion 266 is disposed over the dielectric spacer 212, as shown in FIG. 2J.

Still referring to FIG. 2J, in some embodiments of the present disclosure, the isolation structure 260 can include a bottom surface 272, a bottom surface 274, and a bottom surface 276. As shown in FIG. 2J, the bottom surface 272 is in contact with the first semiconductor layer 220, the bottom surface 274 is in contact with the substrate 202, and the bottom surface 276 is in contact with the dielectric spacer 212. In other words, while the bottom surface 274 is in contact with the substrate 202, the bottom surface 276 is spaced apart from the substrate 202 by the dielectric spacer 212, and the bottom surface 272 is spaced apart from the substrate 202 by the first semiconductor layer 220, such as the first layer 222 of the first semiconductor layer 220. Consequently, the isolation structure 260 includes all-hetero bottom interfaces as shown in FIG. 2J.

Figure 3:
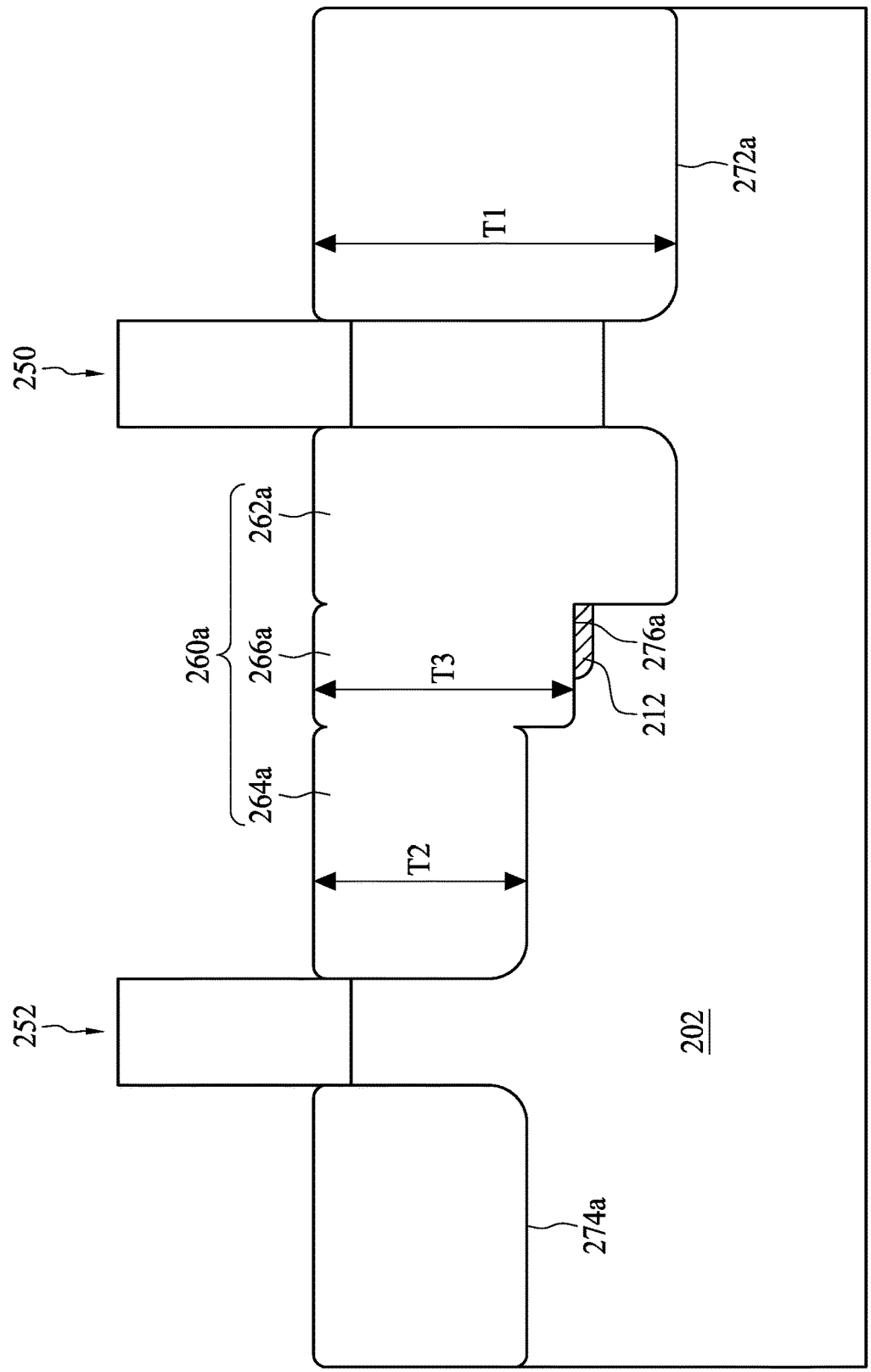
FIG. 3 illustrates a semiconductor structure according to aspects of the present disclosure in one or more embodiments.

FIG. 3 is a schematic drawing illustrating a semiconductor structure 200a. The semiconductor structure 200a can be formed by the method for forming the semiconductor structure 10, and thus those details are omitted. Further, elements the same in the semiconductor structure 200 and the semiconductor structure 200a can include the same materials, and thus those details are also omitted in the interest of brevity. As mentioned above, since the first semiconductor layer 220, the second semiconductor layer 240 and the dielectric spacer 212 include different materials, etching rates of the first semiconductor layer 220, the second semiconductor layer 240 and the dielectric spacer 212 are different using the same or different etchant. Consequently, the third recess (not shown) may include different depths. In some embodiments, the substrate 202 and the dielectric spacer 212 are exposed from a bottom of the third recess while the first semiconductor layer 220 is exposed from a sidewall of the third recess. And the isolation structure 260a formed in the third recess 216 includes different thicknesses. In some embodiments, the isolation structure 260a can include a first portion 262a adjacent to the first fin structure 250, a second portion 264a adjacent to the second fin structure 252 and a third portion 266a sandwiched between the first portion 262a and the second portion 264a. And the third portion 266a physically contacts and connects to both of the first portion 262a and the second portion 264a. The first portion 262a includes a first thickness T1, the second portion 264a includes a second thickness T2, and the third portion 266a includes the third thickness T3. As mentioned above, the first thickness T1 is defined between a top surface and a bottom surface of the first portion 262a, the second thickness T2 is defined between a top surface and a bottom surface of the second portion 264a, and the third thickness T3 is defined between a top surface and a bottom surface of the third portion 266a in some embodiments. In some embodiments, the first thickness T1 is greater than the third thickness T3, and the third thickness T3 is greater than the second thickness T2. In some embodiments, the third portion 266a is disposed over the dielectric spacer 212, as shown in FIG. 3.

Still referring to FIG. 3, in some embodiments of the present disclosure, the isolation structure 260a can include a bottom surface 272a, a bottom surface 274a, and a bottom surface 276a. As shown in FIG. 3, the bottom surface 272a and the bottom surface 274a are both in contact with the substrate 202 while the bottom surface 276a is in contact with the dielectric spacer 212. In other words, while the bottom surface 272a and the bottom surface 274a are both in contact with the substrate 202, the bottom surface 276a is spaced apart from the substrate 202 by the dielectric spacer 212. Consequently, the isolation structure 260a still includes hetero bottom interfaces as shown in FIG. 3.

Figure 4:
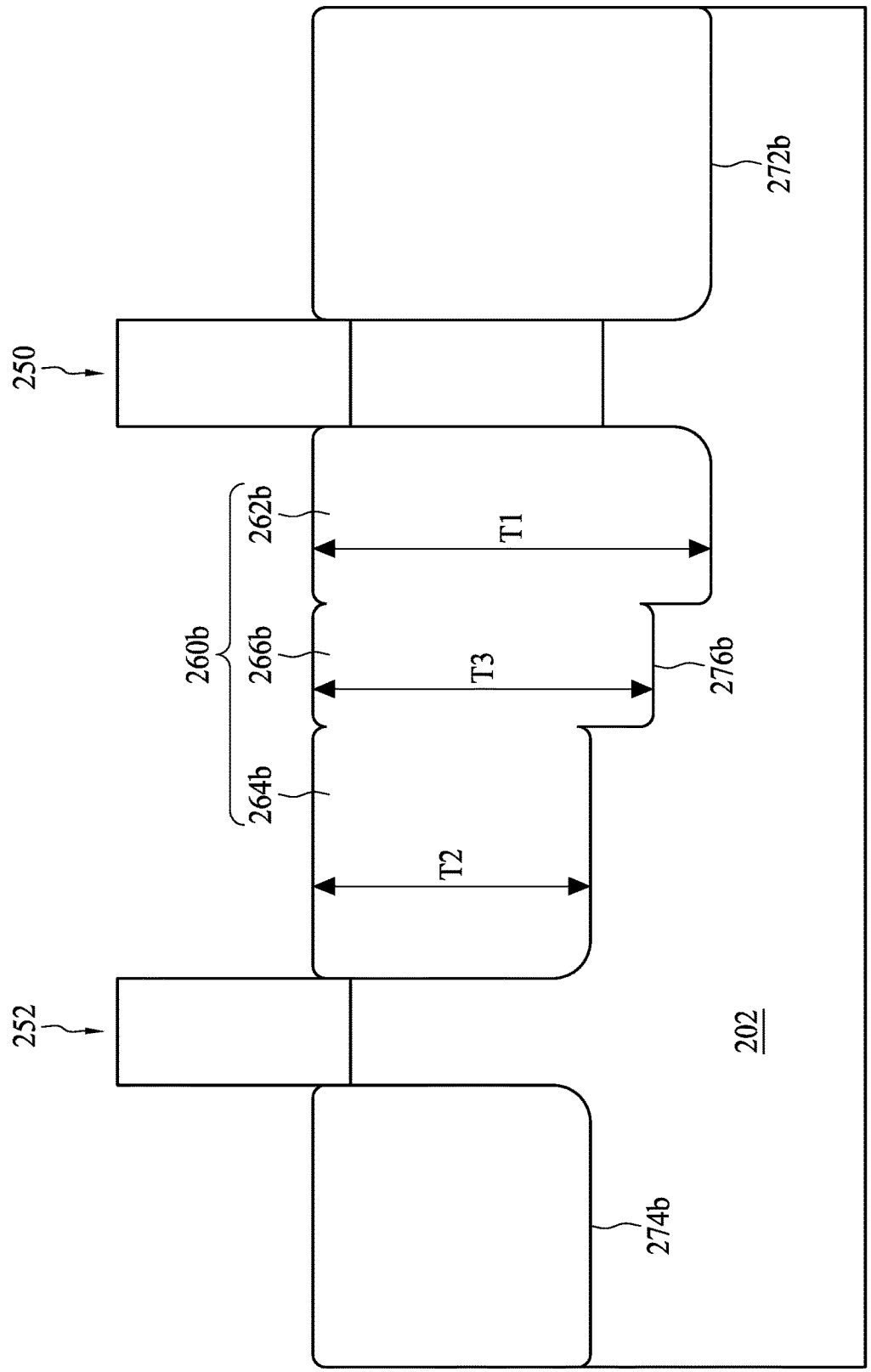
FIG. 4 illustrates a semiconductor structure according to aspects of the present disclosure in one or more embodiments.

FIG. 4 is a schematic drawing illustrating a semiconductor structure 200b. The semiconductor structure 200b can be formed by the method for forming the semiconductor structure 10, and thus those details are omitted. Further, elements the same in the semiconductor structure 200 and the semiconductor structure 200b can include the same materials, and thus those details are also omitted in the interest of brevity. As mentioned above, since the first semiconductor layer 220, the second semiconductor layer 240 and the dielectric spacer 212 include different materials, etching rates of the first semiconductor layer 220, the second semiconductor layer 240 and the dielectric spacer 212 are different using the same or different etchant. Consequently, the third recess (not shown) may include different depths, and the isolation structure 260b formed in the third recess includes different thicknesses. In some embodiments, the isolation structure 260b can include a first portion 262b adjacent to the first fin structure 250, a second portion 264b adjacent to the second fin structure 252 and a third portion 266b sandwiched between the first portion 262b and the second portion 264b. And the third portion 266b physically contacts and connects to both of the first portion 262b and the second portion 264b. The first portion 262b includes a first thickness T1, the second portion 264b includes a second thickness T2, and the third portion 266b includes the third thickness T3. As mentioned above, the first thickness T1 is defined between a top surface and a bottom surface of the first portion 262b, the second thickness T2 is defined between a top surface and a bottom surface of the second portion 264b, and the third thickness T3 is defined between a top surface and a bottom surface of the third portion 266b. In some embodiments, the first thickness T1 is greater than the third thickness T3, and the third thickness T3 is greater than the second thickness T2, as shown in FIG. 4.

Still referring to FIG. 4, in some embodiments of the present disclosure, the isolation structure 260b can include a bottom surface 272b, a bottom surface 274b, and a bottom surface 276b. As shown in FIG. 4, though the isolation structure 260b includes different depths, the bottom surfaces 272b, 274b and 276b are all in contact with the substrate 202 in some embodiments.

Figure 5:
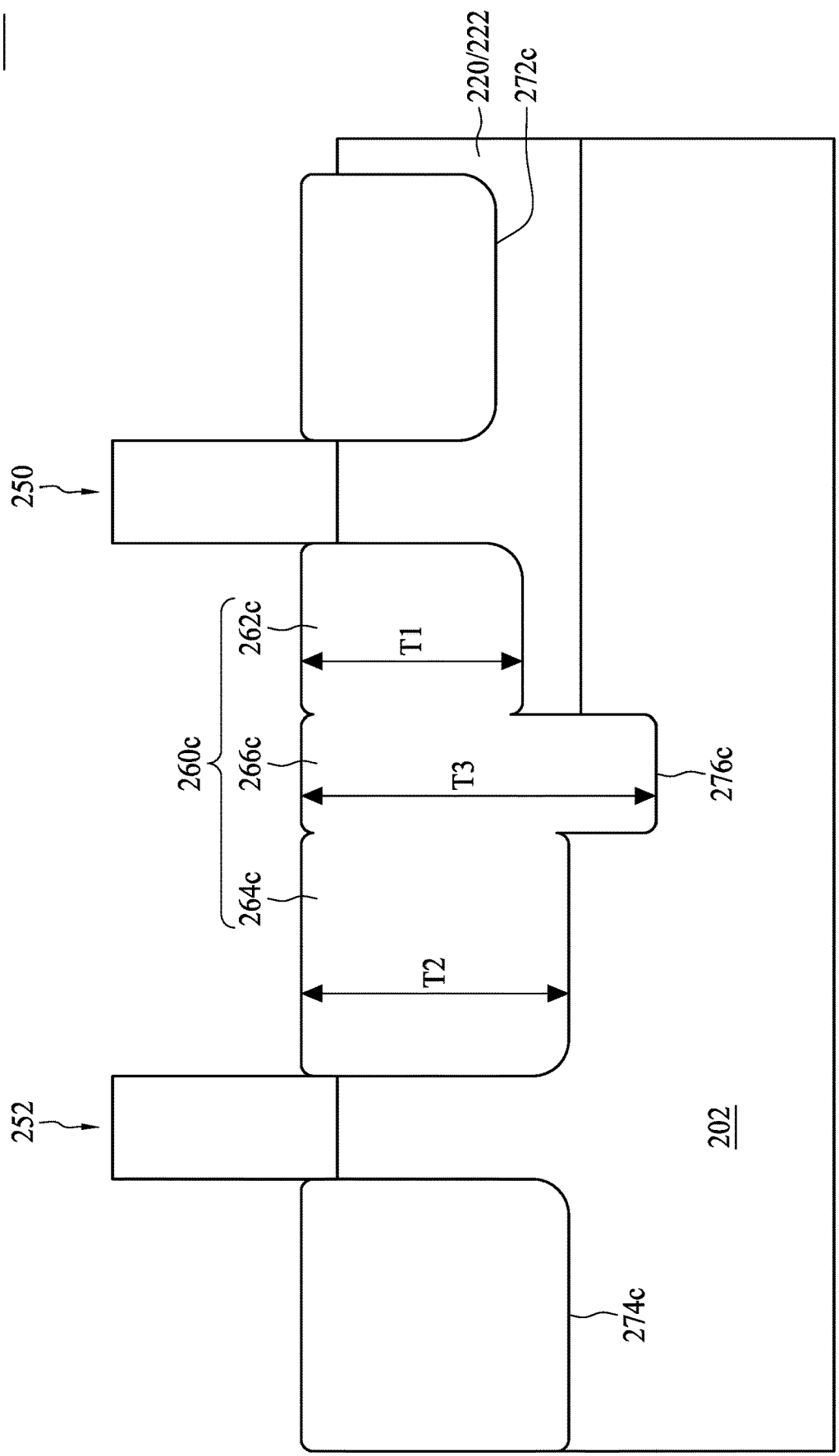
FIG. 5 illustrates a semiconductor structure according to aspects of the present disclosure in one or more embodiments.

FIG. 5 is a schematic drawing illustrating a semiconductor structure 200c. The semiconductor structure 200c can be formed by the method for forming the semiconductor structure 10, and thus those details are omitted. Further, elements the same in the semiconductor structure 200 and the semiconductor structure 200c can include the same materials, and thus those details are also omitted in the interest of brevity. As mention above, since the first semiconductor layer 220, the second semiconductor layer 240 and the dielectric spacer 212 include different materials, etching rates of the first semiconductor layer 220, the second semiconductor layer 240 and the dielectric spacer 212 are different using the same or different etchant. Consequently, the third recess (not shown) may include different depths. In some embodiments, the substrate 202 and the first semiconductor layer 220 are exposed from a bottom of the third recess, and the isolation structure 260c formed in the third recess includes different thicknesses. Still referring to FIG. 5, the isolation structure 260c can include a first portion 262c adjacent to the first fin structure 250, a second portion 264c adjacent to the second fin structure 252 and a third portion 266c sandwiched between the first portion 262c and the second portion 264c. And the third portion 266c physically contacts and connects to both of the first portion 262c and the second portion 264c. The first portion 262c includes a first thickness T1, the second portion 264c includes a second thickness T2, and the third portion 266c includes the third thickness T3. As mentioned above, the first thickness T1 is defined between a top surface and a bottom surface of the first portion 262c, the second thickness T2 is defined between a top surface and a bottom surface of the second portion 264c, and the third thickness T3 is defined between a top surface and a bottom surface of the third portion 266c. In some embodiments, the third thickness T3 is greater than the second thickness T2, and the second thickness T2 is greater than the first thickness T1. In some embodiments, the first portion 262c is disposed over the first semiconductor layer 220, such as the first layer 222 of the first semiconductor layer 220, as shown in FIG. 5.

Still referring to FIG. 5, in some embodiments of the present disclosure, the isolation structure 260c can include a bottom surface 272c, a bottom surface 274c, and a bottom surface 276c. As shown in FIG. 5, the bottom surface 274c and the bottom surface 276c are both in contact with the substrate 202 while the bottom surface 272c is in contact with the first semiconductor layer 220. In other words, while the bottom surface 274c and the bottom surface 276c are both in contact with the substrate 202, the bottom surface 272c is spaced apart from the substrate 202 by the by the first semiconductor layer 220, such as the first layer 222 of the first semiconductor layer 220. Consequently, the isolation structure 260c includes hetero bottom interfaces as shown in FIG. 5.

Figure 6:
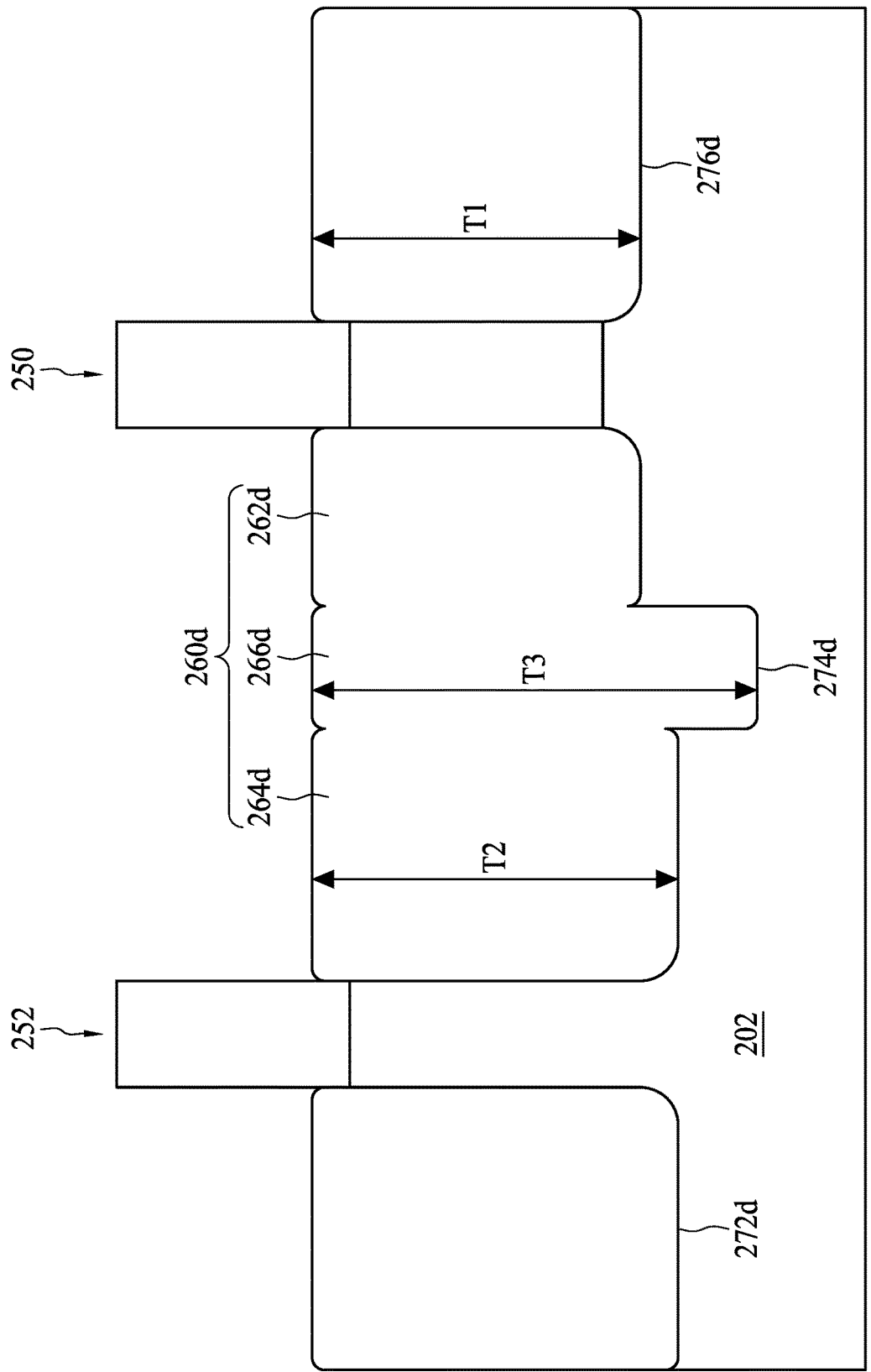
FIG. 6 illustrates a semiconductor structure according to aspects of the present disclosure in one or more embodiments.

FIG. 6 is a schematic drawing illustrating a semiconductor structure 200d. The semiconductor structure 200d can be formed by the method for forming the semiconductor structure 10, and thus those details are omitted. Further, elements the same in the semiconductor structure 200 and the semiconductor structure 200d can include the same materials, and thus those details are also omitted in the interest of brevity. As mention above, since the first semiconductor layer 220, the second semiconductor layer 240 and the dielectric spacer 212 include different materials, etching rates of the first semiconductor layer 220, the second semiconductor layer 240 and the dielectric spacer 212 are different using the same or different etchant. Consequently, the third recess (not shown) may include different depths, and the isolation structure 260d includes different thicknesses. In some embodiments, the isolation structure 260d can include a first portion 262d adjacent to the first fin structure 250, a second portion 264d adjacent to the second fin structure 252 and a third portion 266d sandwiched between the first portion 262d and the second portion 264d. And the third portion 266d physically contacts and connects to both of the first portion 262d and the second portion 264d. The first portion 262d includes a first thickness T1, the second portion 264d includes a second thickness T2, and the third portion 266d includes the third thickness T3. As mentioned above, the first thickness T1 is defined between a top surface and a bottom surface of the first portion 262d, the second thickness T2 is defined between a top surface and a bottom surface of the second portion 264d, and the third thickness T3 is defined between a top surface and a bottom surface of the third portion 266d. In some embodiments, the third thickness T3 is greater than the second thickness T2, and the second thickness T2 is greater than the first thickness T1, as shown in FIG. 6.

Still referring to FIG. 6, in some embodiments of the present disclosure, the isolation structure 260d can include a bottom surface 272d, a bottom surface 274d, and a bottom surface 276d. As shown in FIG. 6, though the isolation structure 260d includes different depths, the bottom surfaces 272d, 274d and 276d are all in contact with the substrate 202.

Additionally, a gate dielectric layer (not shown) and a gate electrode (not shown) traverse the first fin structure 250 and the second fin structure 252 can be formed over the substrate 202. The first fin structure 250 and the second fin structure 252 can include a channel region surrounded or wrapped by the gate electrode and the gate dielectric layer. In some embodiments, the first and second fin structures 250 and 252 can be further doped to provide suitable channel for an n-type FinFET or a p-type FinFET. The first and second fin structures 250 and 252 may be doped using a suitable process, such as an ion implantation process, diffusion process, annealing process, other applicable processes, or combination thereof. The first and second fin structures 250 and 252 can include a source region and a drain region. In some embodiments, the FinFET devices may be a device included in a microprocessor, memory cell, (e.g. static random access memory, SRAM), and/or other integrated circuits. In some embodiments, the first fin struct can include a p+-$Si_{1-x}Ge_x$ strained relaxed buffer region, a p+-strained Ge source region, an i-strained-Si channel region, and an n+-strained-Si drain region for a tunnel FET device. In some embodiments, the first fin structure 250 can include a $Si_{1-x}Ge_x$ strained relaxed buffer region, strained-Si channel and source regions, and a p+-relaxed-Ge source region for an n-type tunnel-FET device. In some embodiments, the second fin structure 252 can include a $Si_{1-x}Ge_x$ buffer region, a Ge source region, and GaAs III-V channel and drain regions for a tunnel-FET device. In some embodiments, the second fin structure 252 can include a p-GaSb drain region, an i-GaSb channel region, an n-InAs source region for a p-type tunnel FET device.

It will be appreciated that in the forgoing method, different epitaxial structures can be integrated to form the CMOS device. Additionally, the forgoing method can be used in different device applications, such as FinFET devices, tunnel FET (T-FET) devices, memory devices, and negative capacitance FET (NCFET) devices, but not limited to this. Further, since the sidewalls of the first recess and the second recess are covered by the dielectric spacer, the first semiconductor layer and the second semiconductor layer mainly formed from the bottom of the first recess and the second recess are obtained. More importantly, by forming the first semiconductor layer in the first recess and the second semiconductor layer in the second recess, strained-Si on strained-relaxed $Si_{1-x}Ge_x$ buffer layer form the NFET and $Si_{1-x}Ge_x$, Ge/$Si_{1-x}Ge_x$ stack, and Si/$Si_{1-x}Ge_x$ for NFET can be formed with the epitaxy defects being trapped at the bottom of the recesses. Thus, device performance can be further improved.

According to one embodiment of the present disclosure, a method for forming a semiconductor structure is provided. The method includes following operations. A substrate including a dielectric structure is provided. A first recess is formed in the substrate. A dielectric spacer is formed over a sidewall of the first recess. A first semiconductor layer is formed to fill the first recess. The dielectric structure is removed to form a second recess over the substrate. A second semiconductor layer is formed to fill the second recess. I some embodiments, the dielectric spacer is sandwiched between the first semiconductor layer and the second semiconductor layer.

According to another embodiment, a method for forming a semiconductor structure is provided. The method includes following operations. A substrate including a first semiconductor layer, a second semiconductor layer and a dielectric spacer sandwiched between the first semiconductor layer and the second semiconductor layer. A portion of the first semiconductor layer is removed to form a first fin structure and a portion of the second semiconductor layer is removed to form a second fin structure over the substrate. A portion of the dielectric spacer is removed to form a first recess in the substrate. In some embodiments, the first fin structure and the second fin structure are exposed from the first recess. An isolation structure is formed in the first recess to electrically isolate the first fin structure from the second fin structure. In some embodiments, the isolation structure has a first thickness measured from a top surface to a first bottom surface, a second thickness measured from the top surface to a second bottom surface and a third thickness measured from the top surface to a third bottom surface. In some embodiments, the first thickness, the second thickness and the third thickness are different from each other, and the first bottom surface, the second bottom surface and the third bottom surface are at different levels.

According another embodiment, a method for forming a semiconductor structure is provided. The method includes following operations. A substrate including a dielectric structure is received. A first recess is formed in the substrate. A dielectric spacer is formed over a sidewall of the first recess. A first semiconductor layer is formed to fill the first recess. The dielectric structure is removed to form a second recess over the substrate. A second semiconductor layer is formed to fill the second recess. In some embodiments, the dielectric spacer is sandwiched between the first semiconductor layer and the second semiconductor layer. A portion of the first semiconductor layer is removed to form a first fin structure, and a portion of the second semiconductor layer is removed to form a second fin structure over the substrate. A portion of the dielectric spacer is removed to form a third recess in the substrate. In some embodiments, the first fin structure and the second fin structure are exposed from the third recess. An isolation structure is formed in the third recess to electrically isolate the first fin structure from the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   providing a substrate comprising a dielectric structure;
   forming a first recess in the substrate;
   forming a dielectric spacer over a sidewall of the first recess;
   forming a first semiconductor layer to fill the first recess;
   removing the dielectric structure to form a second recess over the substrate, wherein the forming of the second recess further comprises:
      forming a patterned mask over the first semiconductor layer; and
      removing the dielectric structure to form the second recess, wherein a depth of the second recess is less than a depth of the first recess; and
   forming a second semiconductor layer to fill the second recess, wherein the dielectric spacer is sandwiched between the first semiconductor layer and the second semiconductor layer.

2. The method of claim 1, further comprising removing a portion of the first semiconductor layer to form a first fin structure and removing a portion of the second semiconductor layer to form a second fin structure over the substrate.

3. The method of claim 2, wherein the first fin structure comprises a first conductivity type and the second fin structure comprises a second conductivity type different from the first conductivity type.

4. The method of claim 2, further comprising:
   forming a third recess in the substrate, wherein the first fin structure and the second fin structure are exposed from the third recess;
   disposing an insulating material to fill the third recess; and
   removing a portion of the insulating material to form an isolation structure in the third recess and to expose the first fin structure and the second fin structure.

5. The method of claim 4, wherein the substrate is exposed in a portion of the third recess.

6. The method of claim 4, wherein the dielectric spacer is exposed in a portion of the third recess.

7. The method of claim 4, wherein the first semiconductor layer is exposed in a portion of the third recess.

8. A method for forming a semiconductor structure, comprising:
   receiving a substrate comprising a first semiconductor layer, a second semiconductor layer and a dielectric spacer sandwiched between the first semiconductor layer and the second semiconductor layer;
   removing a portion of the first semiconductor layer to form a first fin structure and removing a portion of the second semiconductor layer to form a second fin structure over the substrate;
   removing a portion of the dielectric spacer to form a first recess in the substrate, wherein the first fin structure and the second fin structure are exposed from the first recess; and
   forming an isolation structure in the first recess to electrically isolate the first fin structure from the second fin structure, wherein
   wherein the isolation structure comprises a first thickness measured from a top surface of the isolation structure to a first bottom surface of the isolation structure, a second thickness measured from the top surface of the isolation structure to a second bottom surface of the isolation structure and a third thickness measured from the top surface of the isolation structure to a third bottom surface of the isolation structure, wherein the first thickness, the second thickness and the third thickness are different from each other, the first thickness is greater than the third thickness, and the third thickness is greater than the second thickness, the first bottom surface of the isolation structure, the second bottom surface of the isolation structure and the third bottom surface of the isolation structure are at different levels, the first bottom surface of the isolation structure is in contact with the first semiconductor layer, the second bottom surface of the isolation structure is in contact with the substrate, and the third bottom surface of the isolation structure is in contact with the dielectric spacer.

9. The method of claim 8, wherein the first fin structure comprises a first conductivity type and the second fin structure comprises a second conductivity type different from the first conductivity type.

10. The method of claim 8, further comprising:
    receiving the substrate comprising a dielectric structure;
    forming a second recess in the substrate;
    forming the dielectric spacer over a sidewall of the second recess;
    forming the first semiconductor layer to fill the second recess;
    removing the dielectric structure to form a third recess over the substrate; and
    forming the second semiconductor layer to fill the third recess.

11. The method of claim 8, wherein the forming of the isolation structure further comprises:
    disposing an insulating material to fill the first recess; and
    removing a portion of the insulating material to form the isolation structure.

12. A method for forming a semiconductor structure, comprising:
    receiving a substrate comprising a dielectric structure;
    forming a first recess in the substrate;
    forming a dielectric spacer over a sidewall of the first recess;
    forming a first semiconductor layer to fill the first recess;
    removing the dielectric structure to form a second recess over the substrate;
    forming a second semiconductor layer to fill the second recess, wherein the dielectric spacer is sandwiched between the first semiconductor layer and the second semiconductor layer;
    removing a portion of the first semiconductor layer to form a first fin structure and removing a portion of the second semiconductor layer to form a second fin structure over the substrate;
    removing a portion of the dielectric spacer to form a third recess in the substrate, wherein the first fin structure the second fin structure and the dielectric spacer are exposed from the third recess; and
    forming an isolation structure in the third recess to electrically isolate the first fin structure from the second fin structure.

13. The method of claim 12, wherein the first fin structure comprises a first conductivity type and the second fin structure comprises a second conductivity type different from the first conductivity type.

14. The method of claim 1, wherein the forming of the first recess in the substrate further comprises removing a portion of the dielectric structure and a portion of the substrate to form the first recess.

15. The method of claim 8, wherein the isolation structure comprises a first portion adjacent to the first fin structure, a second portion adjacent to the second fin structure and a third portion sandwiched between the first portion and the second portion.

16. The method of claim 15, wherein the first portion has the first thickness, the second portion has the second thickness, and the third portion has the third thickness.

17. The method of claim 12, wherein a bottom surface of the first semiconductor layer is aligned with a bottom surface of the dielectric spacer.

18. The method of claim 1, wherein the first semiconductor layer comprises a multi-layered structure.

19. The method of claim 8, wherein the first semiconductor layer comprises a multi-layered structure.

20. The method of claim 12, wherein the first semiconductor layer comprises a multi-layered structure.

* * * * *